(12) United States Patent
Hong et al.

(10) Patent No.: US 7,067,408 B2
(45) Date of Patent: Jun. 27, 2006

(54) METHOD FOR RELEASING STRESS DURING SEMICONDUCTOR DEVICE FABRICATION

(75) Inventors: Byung-Seop Hong, Ichon-shi (KR); Jae-Geun Oh, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/648,183

(22) Filed: Aug. 25, 2003

(65) Prior Publication Data

US 2004/0126988 A1 Jul. 1, 2004

(30) Foreign Application Priority Data

Dec. 30, 2002 (KR) .......................... 10-2002-86318

(51) Int. Cl.
*H01L 21/3205* (2006.01)
(52) U.S. Cl. .................... 438/585; 438/592; 438/595
(58) Field of Classification Search ................ 438/585, 438/592, 595
See application file for complete search history.

(56) References Cited

U.S. PATENT DOCUMENTS

| | | | | |
|---|---|---|---|---|
| 5,308,655 A | * | 5/1994 | Eichman et al. | ......... 427/248.1 |
| 6,214,680 B1 | * | 4/2001 | Quek et al. | ................. 438/300 |
| 6,380,044 B1 | | 4/2002 | Talwar et al. | |
| 6,455,383 B1 | * | 9/2002 | Wu | .............................. 438/296 |
| 6,599,821 B1 | * | 7/2003 | Lee | ............................. 438/592 |
| 2002/0137321 A1 | * | 9/2002 | Ku et al. | ..................... 438/592 |
| 2002/0197837 A1 | | 12/2002 | Kwak et al. | |
| 2003/0073290 A1 | * | 4/2003 | Ramkumar et al. | ......... 438/287 |

FOREIGN PATENT DOCUMENTS

| | | |
|---|---|---|
| JP | 2001-094105 | 4/2001 |
| JP | 2002-170954 | 6/2002 |
| KR | 1020020072654 | 9/2002 |

OTHER PUBLICATIONS

RD290097A Jun. 1998.*
Wolf, "Silicon Processing For The VLSI Era", vol. 1: Process Technology, Lattice Press, 1986, p. 169.*

* cited by examiner

*Primary Examiner*—Trung Dang
(74) *Attorney, Agent, or Firm*—Blakely Sokoloff Taylor & Zafman (57) ABSTRACT

A semiconductor device and a method for releasing stress exerted while fabricating the semiconductor device. The method for releasing the stress, includes forming a stack layer deposited on a semiconductor sequentially with a gate oxide layer, a poly-silicon layer, a tungsten layer, and a hard mask; selectively oxidizing, wherein only the poly-silicon layer of the stack layer is oxidized; heat treating for releasing stress exerted during the selective oxidation process; and forming a gate sealing nitride layer on the stack layer heat-treated.

23 Claims, 8 Drawing Sheets

METHOD FOR RELEASING STRESS DURING SEMICONDUCTOR DEVICE FABRICATION

FIELD OF THE INVENTION

The present invention relates to semiconductor device fabrication; and, more particularly, to a method for fabricating a semiconductor device having a gate electrode with a tungsten layer.

DESCRIPTION OF RELATED ARTS

Stacked gate structures with a poly-silicon layer, a tungsten (W) layer and a tungsten nitride (WN) layer are used to reduce resistance of gate electrodes.

However, the stacked gate structure mentioned above has some drawbacks such as an interfacial reaction of the poly-silicon layer, the tungsten layer and the tungsten nitride layer during a re-oxidization process using $H_2O$ or $O_2$, an abrupt volume expansion by an oxidation of the tungsten layer, and particle generation. Herein, the re-oxidization process of the tungsten nitride layer is carried out to recover a micro-trench created on a gate oxide layer during an etching process and a loss generated thereby, oxidize the remnant poly-silicon layer remaining on a silicon substrate, and improve reliability of the semiconductor device by increasing thickness of the gate oxide layer formed on an edge area of the gate electrode.

The thickness and quality of the gate oxide layer are factors affecting a hot carrier property, a sub-threshold voltage property such as a leakage current property and a gate induced drain leakage (GIDL) property, a punch-through property and device operating speed.

Therefore, the re-oxidization process is an essential requisite of semiconductor device fabrication.

To overcome the aforementioned drawbacks, a selective oxidation process is suggested. The selective oxidation process oxidizes only the poly-silicon layer and the silicon substrate without oxidizing the tungsten layer and the tungsten nitride layer in a $H_2$ rich ambient including $H_2O$.

In short, the selective oxidation process is used for forming a gate bird's beak required for obtaining superior GILD property.

Figure 1A:
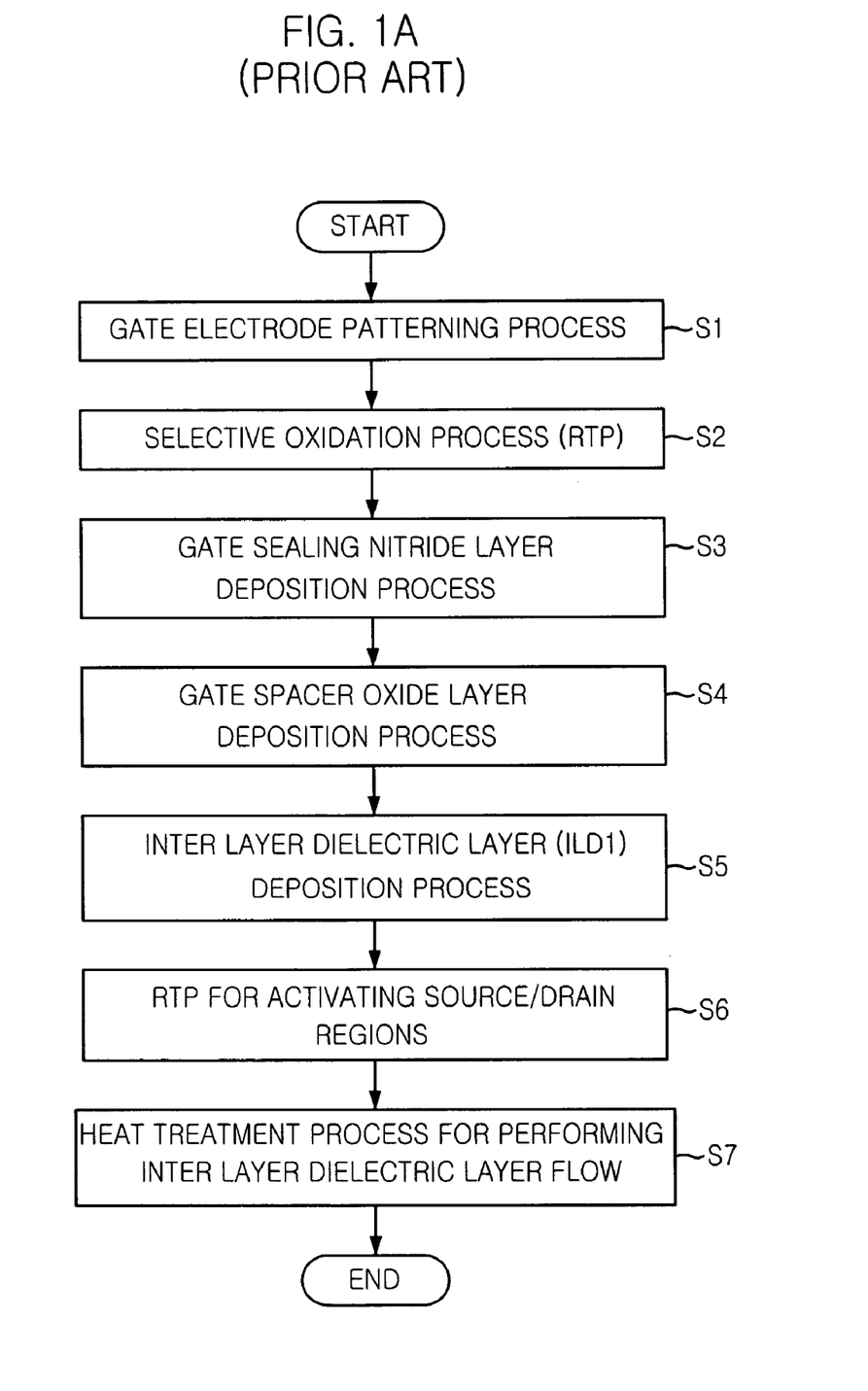
FIG. 1A is a flowchart illustrating a method for fabricating a semiconductor device including a gate electrode with a tungsten layer in accordance with the prior art.
Figure 1B:
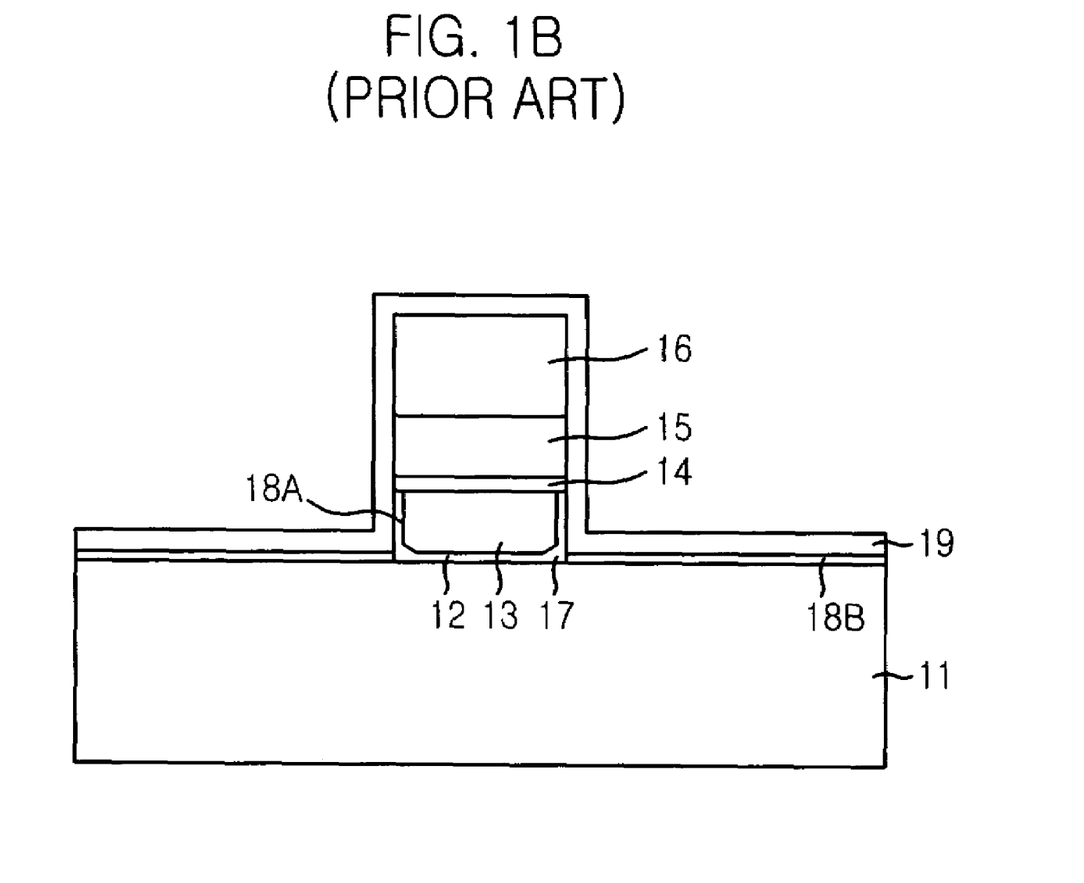
FIG. 1B is a cross-sectional view of the semiconductor device fabricated in accordance with the method illustrated in FIG. 1A.

FIG. 1A is a flowchart showing a method for fabricating a semiconductor device including the gate electrode having a tungsten layer in accordance with the prior art. FIG. 1B is a cross-sectional diagram showing the semiconductor device according to a series of the processes shown in FIG. 1A.

As shown in FIG. 1A, the prior art related to semiconductor device fabrication comprises the following processes: a gate electrode patterning process S1 for forming a stacked gate electrode deposited sequentially with the poly-silicon layer, the tungsten nitride layer and the tungsten layer; the selective oxidation process S2 adopting a rapid thermal process (RTP); a gate sealing nitride layer deposition process S3; a gate spacer oxide layer deposition process S4; an inter layer dielectric layer deposition process S5 using boro-phosphor-silicate-glass (BPSG); a RTP for activating source/drain regions S6; and a heat treatment process S7 for performing the inter layer dielectric layer flow process.

Referring to FIG. 1B, a gate oxide layer 12 is grown on a semiconductor substrate 11 on which a field oxide layer (FOX) is formed. Next, the poly-silicon layer 13, the tungsten nitride layer 14, the tungsten layer 15, and a hard mask 16 are sequentially deposited on the gate oxide layer 12. Next, the hard mask 16, the tungsten layer 15, the tungsten nitride layer 14 and the poly-silicon layer 13 are etched sequentially in order to predetermine the gate electrode.

As a next step, the selective oxidation process is carried out in a $H_2O$ ambient for the purpose of forming the gate bird's beak. At this time, a silicon oxide layer 18A is formed on both lateral sides of the poly-silicon layer 13 by carrying out the selective oxidation process, and a silicon oxide layer 18B is also formed on the semiconductor substrate 11.

Next, the above structure including the gate electrode is covered with the gate sealing nitride layer 19 to prevent an oxidation of the tungsten layer 15 while proceeding a heat treatment process.

However, the semiconductor device fabricated in accordance with the prior art has a drawback such as a deterioration of a data retention time property. In short, a trap or a defect is generated at a cell conjunction due to a thermal stress developed by an abrupt change in thermal history created on a wafer especially during the RTP process, and the trap or defect acts as a path for a leakage current. Accordingly, the data retention time property is deteriorated, and consequently, a refresh time fail is induced.

As shown in FIG. 1B, for a DRAM semiconductor device having a triple stack layer constituted with the poly-silicon layer, the tungsten nitride layer, and tungsten layer, the selective oxidation process should be carried out to obtain the GILD property. At this time, the selective oxidation process uses a method that adopts the RTP process having a rising and falling thermal history. Accordingly, the semiconductor substrate is affected by a stress exerted by the RTP process. For instance, a trap site or a defect is created at a gate channel or a cell conjunction, and eventually, increasing a conjunction leakage.

Now, in a 0.13 μm and less than 0.13 μm semiconductor technology, the gate sealing nitride deposition process for protecting the tungsten layer and follow-up processes are carried out without releasing the stress occurring after the selective oxidation process is performed. Therefore, the stress becomes more serious and accordingly, a deterioration of a refresh time is manifested more frequently.

Figure 2:
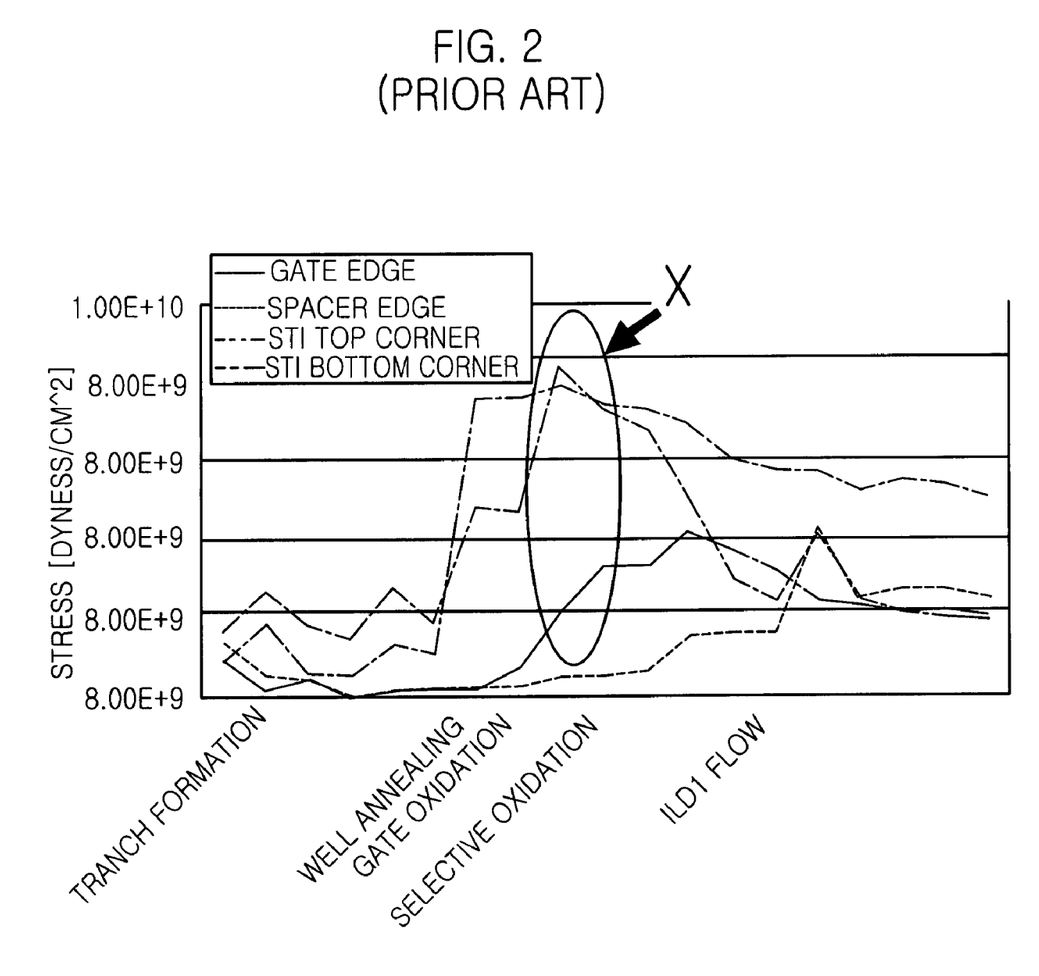
FIG. 2 is a diagram showing a history of the stress exerted as a series of processes are carried out in accordance with a prior art.

FIG. 2 is a graph showing a stress history measured while a series of processes in accordance with the prior art are performed. Herein, an abscissa shows each name of the processes and an ordinate shows a stress level measured during each of the processes. In addition, the graph shows thermal stress values measured at a gate edge, a spacer edge, a top corner of a shallow trench isolation STI or FOX top corner, and a shallow trench isolation STI or FOX, and a bottom corner of the STI or FOX.

As shown in FIG. 2, it is evident that the stress becomes more serious during a gate oxide layer formation process, a gate electrode patterning process and the selective oxidation process than the stress exerted during a trench formation process for forming the STI and a well annealing process. However, the stress starts being released during an inter layer dielectric layer (ILD1) flow process. Especially, it is observed that a strong stress is exerted during the selective oxidation process (X).

Accordingly, a special method for technically releasing the stress exerted during the selective oxidation process is required.

SUMMARY OF THE INVENTION

It is, therefore, an object of the present invention to provide a method for releasing stress exerted during a semiconductor device fabricating process.

In accordance with an aspect of the present invention, there is provided the method for releasing the stress, including: forming a stack layer deposited on a semiconductor sequentially with a gate oxide layer, a poly-silicon layer, a tungsten layer, and a hard mask; carrying out a selective oxidation process, wherein the poly-silicon layer of the stack layer is only oxidized; performing a heat treatment process for releasing a stress exerted during the selective oxidation process; and carrying out a process for forming a gate sealing nitride layer on the stack layer heat-treated.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Hereinafter, a method is disclosed for releasing stress exerted during fabrication of a semiconductor device including a gate electrode with a tungsten layer.

Figure 3:
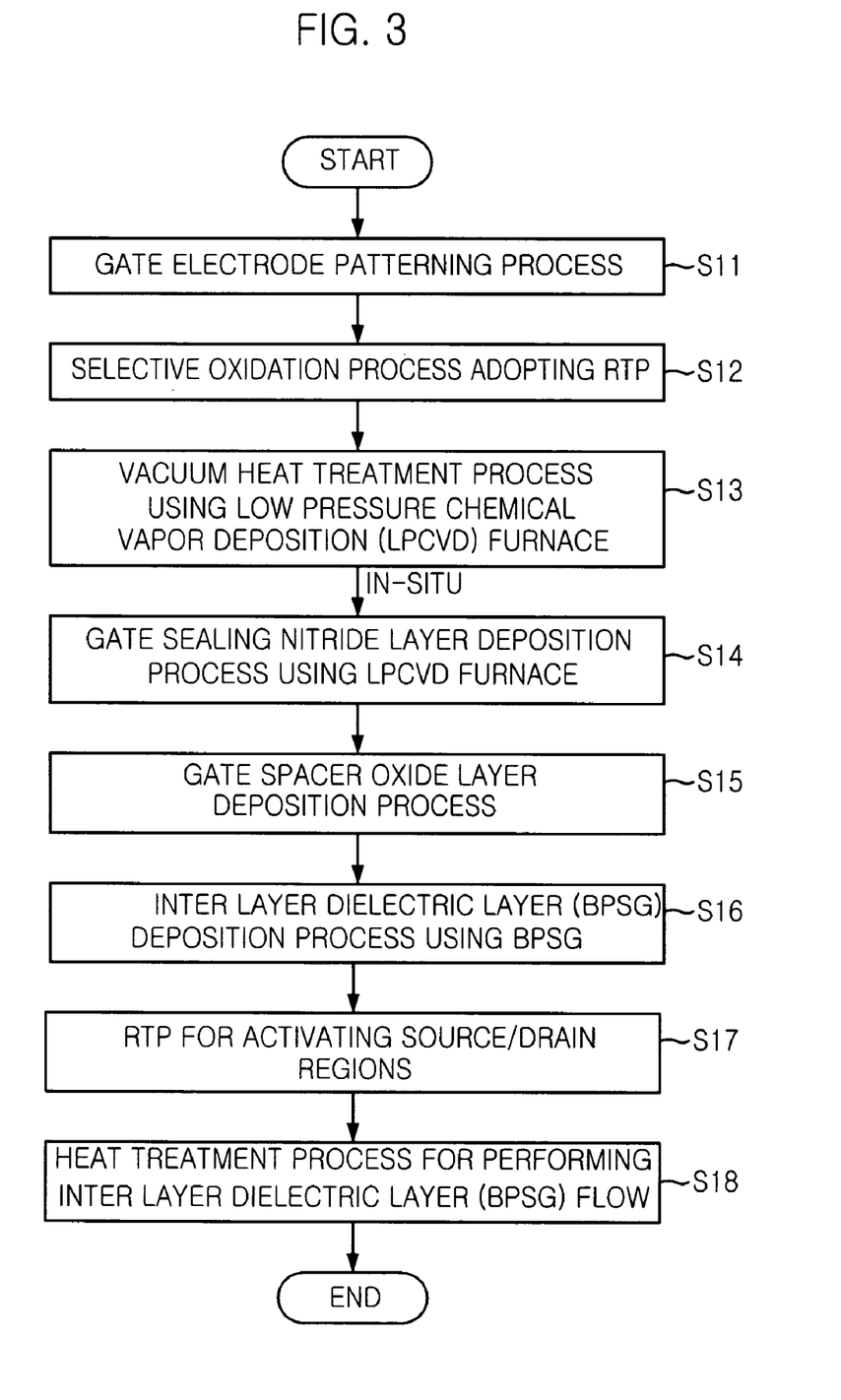
FIG. 3 is a flowchart showing a method for fabricating a semiconductor device in accordance with a first preferred embodiment of the present invention.

FIG. 3 is a flowchart showing a method for fabricating a semiconductor device in accordance with a first preferred embodiment of the present invention.

Referring to FIG. 3, the semiconductor device in accordance with the first preferred embodiment of the present invention is fabricated through the following sequential process steps: a gate electrode patterning process S11 forming a gate electrode stacked sequentially with a poly-silicon layer, a tungsten nitride layer and a tungsten layer; a selective oxidation process S12 adopting a rapid thermal process (RTP); a vacuum heat treatment process S13 using a low pressure chemical vapor deposition (LPCVD) furnace; a gate sealing nitride layer deposition process S14; a gate spacer oxide layer deposition process S15; an inter layer dielectric layer (ILD1) deposition process S16 using a boro-phospho-silicate-glass (BPSG); another RTP for activating source/drain regions S17; and a heat treatment process S18 for the inter layer dielectric layer (ILD1) flow. Herein, both the vacuum heat treatment process S13 and the gate sealing nitride layer deposition process S14 using the LPCVD furnace are carried out under an in-situ method.

As shown in FIG. 3, the vacuum heat treatment process S13 using the LPCVD furnace is carried out right after the selective oxidation process S12 adopting the rapid thermal process. Herein, the vacuum heat treatment is used for not only removing a trap or defect generated at a cell conjunction of a semiconductor substrate but also releasing stress caused by the RTP process used during the selective oxidation process S12, wherein the cell conjunction is formed at a bottom of the gate oxide layer.

As a next step, the gate sealing nitride layer deposition process S14 is performed to prevent the tungsten layer from being oxidized abnormally during succeeding processes. At this time, the gate sealing nitride layer is deposited under the in-situ method by using the LPCVD furnace. More specifically, the gate sealing nitride layer is deposited under the in-situ method after gradually decreasing a heat treatment temperature to a target temperature during the vacuum heat treatment process S13 using the LPCVD furnace.

Eventually, since both of the vacuum heat treatment process S13 and the gate sealing nitride layer deposition process S14 using the LPCVD furnace are carried out under the in-situ method, the trap or defect generated by the stress induced during the selective oxidation process S12 can be cured and thereby, the leakage path of the cell conjunction is removed by recovering a distorted semiconductor substrate. Herein a temperature of the LPCVD furnace is increased above about 750° C. at a slowly rising rate and decreased thereafter in order to recover the distorted semiconductor substrate.

In addition, the vacuum heat treatment process S13 using the LPCVD furnace is performed at a high temperature and at a normal pressure in a nitrogen gas ambient for a predetermined time. Accordingly, a series of the processes mentioned above impedes impurities from existing in the nitrogen gas and the tungsten layer from abnormally being oxidized at a normal pressure. Furthermore, it is possible to obtain a simplified process for fabricating the semiconductor device by using the in-situ vacuum heat treatment method during the gate sealing nitride layer deposition.

The in-situ method of the heat treatment process and the gate sealing nitride layer deposition process will now be described more specifically. First of all, the semiconductor substrate to which the selective oxidation process is implemented is loaded into the LPCVD furnace and heat-treated by increasing the temperature of the LPCVD furnace from normal room temperature to a target temperature in vacuum ambient. Next, the gate sealing nitride layer is deposited while the temperature of the LPCVD furnace is decreased from the heat treatment temperature to a deposition temperature for depositing the gate sealing nitride layer. As a last step, the temperature of the LPCVD furnace is decreased to the normal temperature and the semiconductor device is unloaded from the LPCVD furnace. Herein, the heat treatment temperature ranges from about 750° C. to about 1000° C. and the vacuum ambient has a pressure of about $10^{-3}$ torr to about $10^{-2}$ torr. Preferably, the rising rate of the temperature for the heat treatment process ranges from about 3° C./min to about 25° C./min and a falling rate of the temperature during the gate sealing nitride layer deposition ranges from 3° C./min to about 25° C./min. Also, the total heat treatment time is within a range of about 10 minutes to about 240 minutes.

Figure 4:
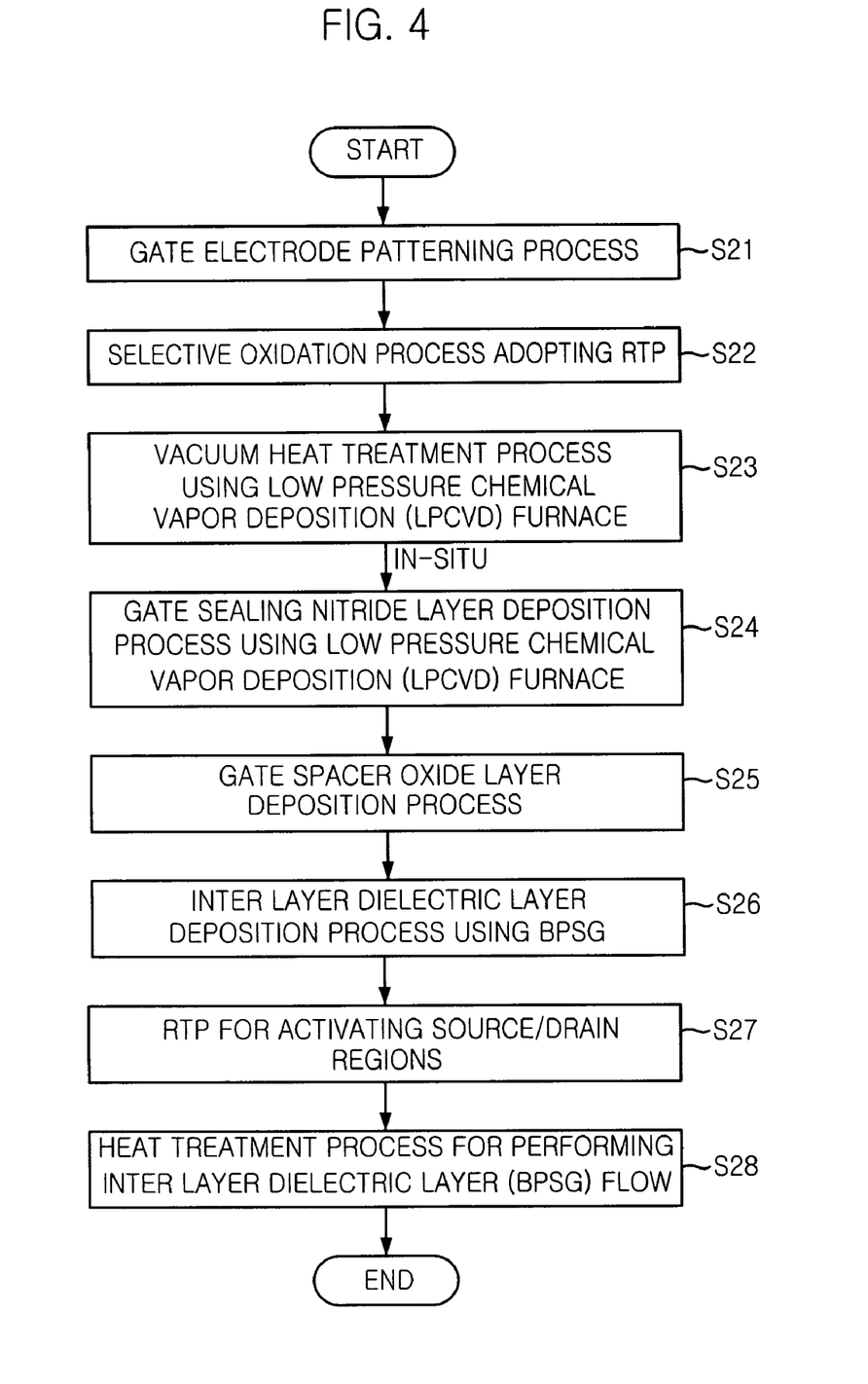
FIG. 4 is a flowchart showing a method for fabricating a semiconductor device in accordance with a second preferred embodiment of the present invention.

FIG. 4 is a flow chart showing a method for fabricating a semiconductor device in accordance with a second preferred embodiment of the present invention.

Referring to FIG. 4, the semiconductor device in accordance with the second preferred embodiment of the present invention is fabricated through the following sequential processes: a gate electrode patterning process S21 forming a stacked gate electrode stacked sequentially with a polysilicon layer, a tungsten nitride layer, and a tungsten layer; a selective oxidation process S22 adopting a RTP; a vacuum heat treatment process S23 using a low pressure chemical vapor deposition (LPCVD) furnace; a gate sealing nitride layer deposition process S24 using the LPCVD furnace; a gate spacer oxide layer deposition process S25; an ILD1 deposition process using BPSG S26; a RTP for activating source/drain regions S27; and a heat treatment process for the ILD1 flow S28. Herein, the vacuum heat treatment process S23 and the gate sealing nitride layer deposition process S22 both using the LPCVD furnace are carried out under an ex-situ method.

As shown in FIG. 4, the vacuum heat treatment process S23 using the LPCVD furnace is carried out right after the selective oxidation process S22 adopting the RTP. Herein, the vacuum heat treatment process S23 is for not only curing a trap or defect generated at a cell conjunction of a semiconductor substrate formed at a bottom of the gate oxide layer but also releasing a stress caused by the RTP used during the selective oxidation process S22.

As a next step, the gate sealing nitride layer deposition process S24 is performed in the same LPCVD furnace or two different LPCVD furnaces under the ex-situ method so as to prevent the tungsten layer from being oxidized abnormally during succeeding processes.

More specifically, the semiconductor substrate at which the selective oxidation process has been performed is loaded in a first LPCVD furnace. Herein, a temperature of the first LPCVD furnace is slowly increased and the semiconductor substrate is heat-treated in a vacuum ambient. Next, the temperature of the first LPCVD furnace is decreased to a room temperature and the semiconductor substrate is unloaded from the first LPCVD furnace. As a next step, the unloaded semiconductor substrate is loaded again into the first LPCVD furnace or a second LPCVD furnace, wherein a gate sealing nitride layer is deposited on the semiconductor substrate. At this time, the heat treatment temperature ranges from about 750° C. to about 1000° C., and the vacuum ambient has a pressure of about $10^{-3}$ torr to about $10^{-2}$ torr. Preferably, the rising rate of the heat treatment temperature is from about 3° C./min to about 25° C./min, the falling rate of the deposition temperature ranges from about 1° C./min to about 20° C./min. Also, the total heat treatment time is from about 10 mins to about 240 mins.

Figure 5:
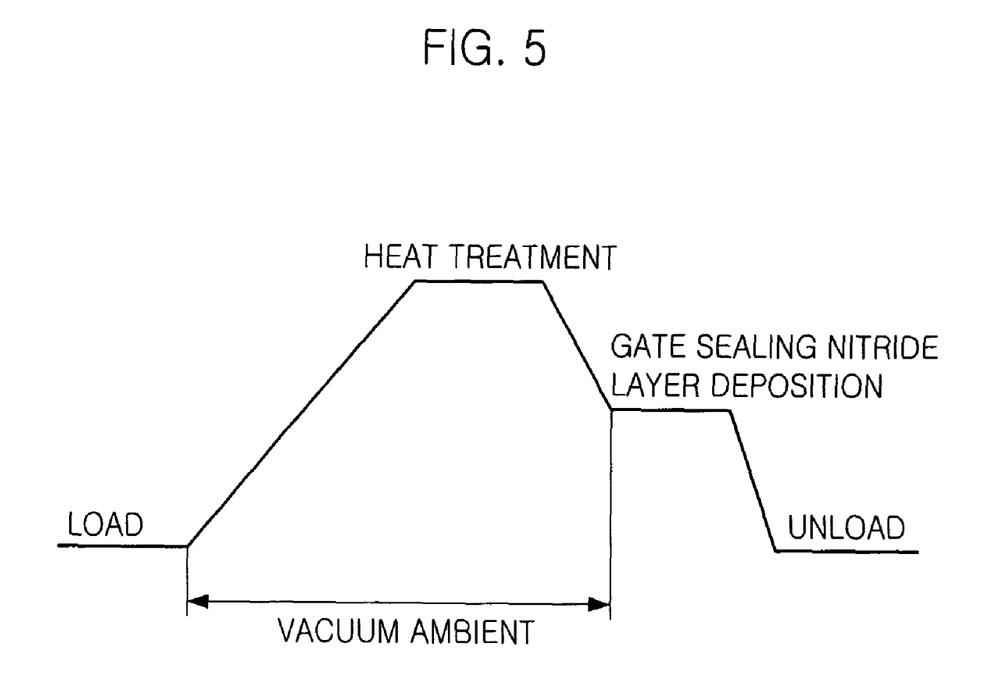
FIG. 5 is a diagram showing a thermal history tendency of a series of deposition processes for a gate sealing nitride layer shown in FIG. 3 and FIG. 4.

FIG. 5 is a diagram showing a thermal history tendency of the deposition processes for the gate sealing nitride layer shown in FIG. 3 and FIG. 4.

Referring to FIG. 5, the semiconductor substrate is loaded into the LPCVD furnace and then is heat-treated through gradually increasing a temperature of the LPCVD furnace. The temperature of the LPCVD is decreased after finishing the heat treatment and the gate sealing nitride layer is deposited thereafter. As a last step, the temperature of the LPCVD furnace is decreased to room temperature at which the semiconductor substrate was loaded and the semiconductor substrate is unloaded from the LPCVD furnace. At this time, an ambient in the LPCVD furnace is kept in a vacuum condition until depositing the gate sealing nitride layer.

Figure 6:
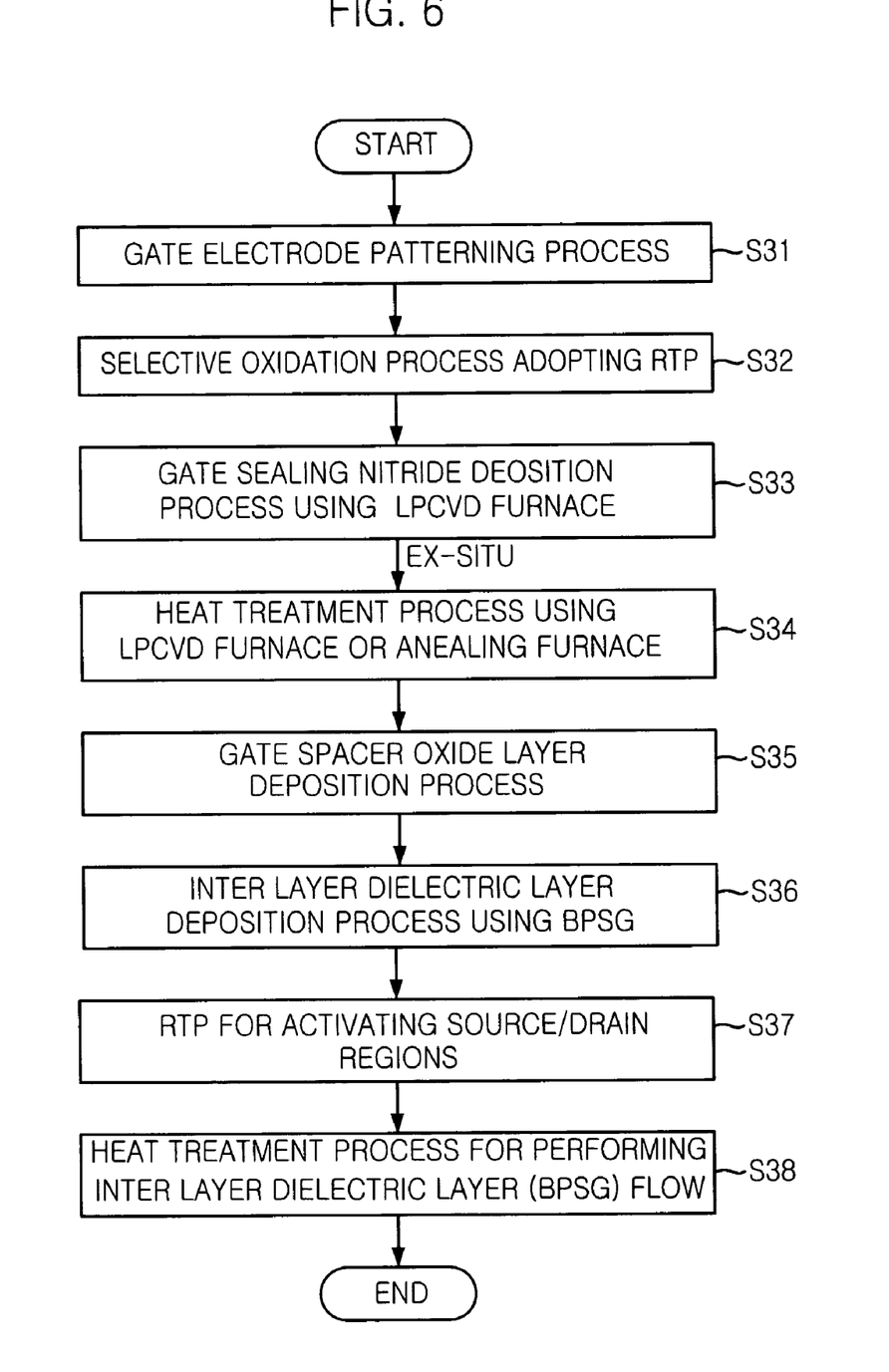
FIG. 6 is a diagram showing a flowchart of a method for fabricating a semiconductor device in accordance with a third preferred embodiment of the present invention.

FIG. 6 is a flow chart showing a method for fabricating a semiconductor device in accordance with a third preferred embodiment of the present invention.

Referring to FIG. 6, the semiconductor device in accordance with the third preferred embodiment of the present invention is fabricated through the following sequential processes: a gate electrode patterning process S31 forming a stacked gate electrode stacked sequentially with a polysilicon layer, a tungsten nitride layer, and a tungsten layer; a selective oxidation process adopting a RTP S32; a gate sealing nitride layer deposition process S33; a heat treatment process S34 using a low pressure chemical vapor deposition (LPCVD) furnace or an annealing furnace; a gate spacer oxide layer deposition process S35; an inter layer dielectric layer(ILD1) deposition process S36 using the BPSG material; a RTP for activating source/drain regions S37; and a heat treatment process for the ILD1 flow.

As shown in FIG. 6, compared with the first and second preferred embodiments, the heat treatment process S34 according to the third preferred embodiment is carried out in the LPCVD furnace or the annealing furnace in order to release a stress exerted after finishing the gate sealing nitride layer deposition process. Furthermore, the heat treatment process mentioned above releases not only the stress exerted during the selective oxidation process S32 but also the stress exerted during the gate sealing nitride layer deposition process S33.

More specifically, the heat treatment process is carried out in the LPCVD furnace or the annealing furnace in a vacuum ambient or in a nitrogen or inert gas ambient. At this time, a temperature for the heat treatment is gradually increased over about 750° C. and is slowly decreased to room temperature after finishing the heat treatment. In addition, the gate sealing nitride deposition process (S33) and the heat treatment process S34 are carried out in two same types of furnaces or two different types of furnaces under an ex-situ method.

In particular, there are two ex-situ methods used for the gate sealing nitride layer deposition process S33 and the heat treatment process S34. Explaining the first ex-situ method in detail, in a first LPCVD furnace, the gate sealing nitride layer is deposited and the semiconductor substrate deposited with the gate sealing nitride layer is loaded in a second LPCVD furnace. Next, a temperature of the second LPCVD furnace is gradually increased from room temperature to a target heat treatment temperature and the semiconductor substrate is heat-treated in a vacuum ambient. After finishing the heat treatment process, the temperature of the second LPCVD furnace is decreased from the target heat treatment temperature to room temperature and the semiconductor substrate is unloaded thereafter. Explaining the second ex-situ method, the gate sealing nitride layer is deposited on the semiconductor substrate in the LPCVD furnace and then, the semiconductor substrate is loaded in the annealing furnace. Next, a temperature of the annealing furnace is slowly increased from room temperature to a target heat treatment temperature, and the semiconductor substrate is heat-treated in a vacuum ambient. Continuously, the heat treatment temperature is decreased to room temperature and the semiconductor substrate is unloaded thereafter.

During the heat treatment processes in accordance with the first ex-situ method and the second ex-situ method, the heat treatment temperature for the heat treatment process ranges from about 750° C. to about 1000° C. and the vacuum ambient has a pressure of about $10^{-3}$ torr to about $10^{-2}$ torr. Particularly, a rising rate of the heat treatment temperature ranges from about 3° C./min to about 25° C./min, and a falling rate of the temperature until the semiconductor substrate is unloaded ranges from about 1° C./min to about 20° C./min. Also, a total heat treatment time ranges from about 10 minutes to about 240 minutes.

Figure 7:
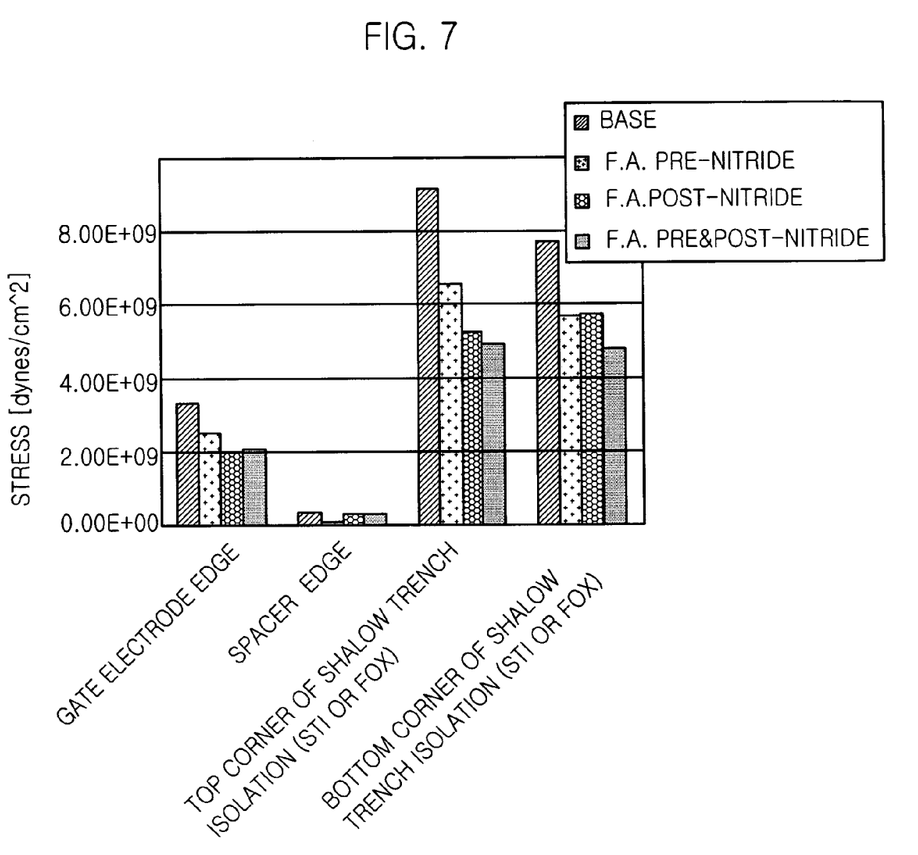
FIG. 7 is a graph showing a stress change before and after a heat treatment process.

FIG. 7 is a graph showing changes in the stress before and after a heat treatment process. An ordinate expresses the stress in a numerical value and an abscissa shows each area at which each numerical value of the stress is measured. Concretely, the stress is measured at a gate electrode edge, a spacer edge, a top corner of a shallow trench isolation (STI or FOX) and a bottom corner of the STI.

As shown in FIG. 7, compared with a base case in which there is no heat treatment process for releasing the stress exerted after the selective oxidation process, a case of the heat treatment performed before depositing the gate sealing nitride layer, another case of the heat treatment performed after depositing the same, and another case of the heat treatment performed before and after depositing the same show that the stress values measured at each area are generally decreased.

Table. 1 shows a comparison of a refresh time (tREF) value of the semiconductor device fabricated in accordance with the prior art with the tREF value of the semiconductor device fabricated in accordance with the present invention

TABLE 1

| Applied art | Improved portion/250 ms (tREF) |
| --- | --- |
| Prior art | 89.2 ms/250 ms |
| Vacuum heat treatment-30 secs (Present Invention) | 91.3 ms/250 ms |
| Vacuum heat treatment-60 secs (Present Invention) | 92.1 ms/250 ms |

According to Table. 1, it is confirmed that the refresh time is improved when the vacuum heat treatment process is used. Furthermore, it is also shown that the refresh time is improved as the vacuum heat treatment process time is increased.

While the present invention has been shown and described with respect to the particular embodiments, it will be apparent to those skilled in the art that many changes and modification may be made without departing from the spirit and scope of the invention as defined in the appended claims.

What is claimed is:

1. A method for fabricating a semiconductor device, comprising:
   forming a stack layer of a gate layer, a poly-silicon layer, a tungsten layer, and a hard mask sequentially deposited on a semiconductor substrate;
   carrying out a selective oxidation process adopting a rapid thermal process (RTP), wherein the poly-silicon layer of the stack layer is only oxidized;
   performing a heat treatment process by slowly increasing a temperature of a LPCVD furnace from a room temperature to a target temperature for the heat treatment process and keeping the target temperature in a vacuum ambient;
   decreasing the temperature of the LPCVD furnace from the target temperature for the heat treatment process to a target temperature for depositing a gate sealing nitride layer; and
   carrying out a process for forming the gate sealing nitride layer on the heat treated stack layer.

2. The method as recited in claim 1, wherein the heat treatment process and the gate sealing nitride layer formation process are carried out by using the LPCVD furnace under an in-situ method.

3. The method as recited in claim 2, wherein the in-situ method includes:
   loading the semiconductor substrate at which the selective oxidation process is carried out in the LPCVD furnace before performing the heat treat process; and
   unloading the semiconductor substrate after depositing the gate sealing nitride layer.

4. The method as recited in claim 3, wherein the target temperature for the heat treatment process ranges from about 750° C. to about 1000° C. and a pressure of the vacuum ambient ranges from about $10^{-3}$ torr to about $10^{-2}$ torr.

5. The method as recited in claim 3, wherein a rising rate of the temperature for the heat treatment process ranges from about 3° C./min to about 25° C./min.

6. The method as recited in claim 3, wherein a falling rate of the temperature for depositing the gate sealing nitride layer ranges from about 1° C./min to about 20° C./min.

7. The method as recited in claim 3, wherein the heat treatment process is carried out for about 10 minutes to about 240 minutes.

8. The method as recited in claim 1, wherein the heat treatment process and the gate sealing nitride layer formation process carried out in the same LPCVD furnace or two different LPCVD furnaces under an ex-situ method.

9. The method as recited in claim 8, wherein the ex-situ method includes:
   loading the semiconductor substrate at which the selective oxidation process is carried out in a first low pressure chemical vapor deposition LPCVD furnace before performing the heat treatment process;
   unloading the semiconductor substrate after decreasing the temperature of the LPCVD furnace to a room temperature; and
   loading the unloaded semiconductor substrate in the first LPCVD furnace or a second LPCVD furnace before depositing the gate sealing nitride layer.

10. The method as recited in claim 9, wherein the target temperature for the heat treatment process ranges from about 750° C. to about 1000° C. and a pressure of the vacuum ambient ranges from about $10^{-3}$ torr to about $10^{-2}$ torr.

11. The method as recited in claim 9, wherein a rising rate of the temperature for the heat treatment process ranges from about 3° C./min to about 25° C./min.

12. The method as recited in claim 9, wherein a falling rate of the temperature for depositing the gate sealing nitride layer ranges from about 1° C./min to about 20° C./min.

13. The method as recited in claim 9, wherein the heat treatment process is carried out for about 10 minutes to about 240 minutes.

14. A method for fabricating a semiconductor device, comprising:
   forming a stack layer of a gate oxide layer, a poly-silicon layer, a tungsten layer, and a hard mask sequentially deposited on a semiconductor substrate;
   carrying out a selective oxidation process, wherein the poly-silicon layer of the stack layer is only oxidized;
   depositing a gate sealing nitride layer on the stack layer selectively oxidized by low pressure chemical vapor deposition (LPCVD);
   performing a heat treatment process by slowly increasing a temperature of another LPCVD furnace or an annealing furnace from a room temperature to a target temperature for the heat treatment process and maintaining the target temperature in a vacuum or inert gas ambient of an LPCVD furnace or an annealing furnace for releasing a stress exerted during the selective oxidation process and gate sealing nitride layer deposition process;

decreasing the temperature of the LPCVD furnace from the target temperature for the heat treatment to a room temperature; and performing a rapid thermal process (RTP) for activating source/drain regions of the semiconductor device.

15. The method as recited in claim 14, wherein the gate sealing nitride layer deposition process and the heat treatment process are carried out in the identical furnace or in two different LPCVD furnaces under an ex-situ method.

16. The method as recited in claim 15, wherein the ex-situ method includes:

loading the semiconductor substrate on which the gate sealing nitride layer is deposited in another LPCVD furnace;

unloading the semiconductor substrate after decreasing the temperature of the another LPCVD furnace from the target temperature for the heat treatment to a room temperature.

17. The method as recited in claim 15, wherein the ex-situ method includes:

loading the semiconductor substrate on which the gate sealing nitride layer is deposited in an annealing furnace used for the heat treatment process; and unloading the semiconductor substrate after decreasing the temperature of the annealing furnace.

18. The method as recited in claim 16, wherein the temperature for the heat treatment process ranges from about 750° C. to about 1000° C. and a pressure of the vacuum ambient ranges from about $10^{-3}$ torr to about $10^{-2}$ torr.

19. The method as recited in claim 16, wherein a rising rate of the temperature for the heat treatment process ranges from about 3° C./min to about 25° C./min.

20. The method as recited in claim 16, wherein a falling rate of the temperature for the heat treatment process ranges from about 1° C./min to about 20° C./min.

21. The method as recited in claim 17, wherein the temperature for the heat treatment process ranges from about 750° C. to about 1000° C. and a pressure of the vacuum ambient ranges from about $10^{-3}$ torr to about $10^{-2}$ torr.

22. The method as recited in claim 17, wherein a rising rate of the temperature for the heat treatment process ranges from about 3° C./min to about 25° C./min.

23. The method as recited in claim 16, wherein a falling rate of the temperature for the heat treatment process ranges from about 1° C./min to about 20° C./min.

* * * * *